(12) United States Patent
Dogan

(10) Patent No.: US 7,898,309 B1
(45) Date of Patent: Mar. 1, 2011

(54) ANALOG DUTY CYCLE CORRECTION LOOP FOR CLOCKS

(75) Inventor: Hakan Dogan, Berkeley, CA (US)

(73) Assignee: Atheros Communications, Inc., San Jose, CA (US)

( * ) Notice: Subject to any disclaimer, the term of this patent is extended or adjusted under 35 U.S.C. 154(b) by 0 days.

(21) Appl. No.: 12/466,288

(22) Filed: May 14, 2009

(51) Int. Cl.
 *H03K 3/017* (2006.01)
 *H03K 5/04* (2006.01)
 *H03K 7/08* (2006.01)

(52) U.S. Cl. .................................... 327/175; 327/176

(58) Field of Classification Search .................. 327/175, 327/176
See application file for complete search history.

(56) References Cited

U.S. PATENT DOCUMENTS 5,757,218 A 5/1998 Blum
7,180,346 B2 2/2007 Lee
7,368,966 B2 * 5/2008 Hur ............................. 327/175
2009/0322390 A1 * 12/2009 Shim ........................... 327/158

* cited by examiner

*Primary Examiner*—Lincoln Donovan
*Assistant Examiner*—John W Poos
(74) *Attorney, Agent, or Firm*—Bever, Hoffman & Harms, LLP; Jeanette S. Harms

(57) ABSTRACT

Providing duty cycle correction can include determining whether a clock signal has a duty cycle greater than 50% based on averaging the clock signal and comparing that averaged clock signal to ½ VDD. When the duty cycle is greater than 50%, the clock signal can be selected. When the duty cycle is less than 50%, the inverted clock signal can be selected. Thus, a duty cycle corrected clock signal can be generated based on the clock signal or the inverted clock signal. Notably, a duty cycle control signal can be adjusted based on comparisons of an averaged, duty cycle corrected clock signal and predetermined low/high voltage ranges. Components performing comparing functions can be strobed based on a count performed on the clock signal.

14 Claims, 9 Drawing Sheets

ANALOG DUTY CYCLE CORRECTION LOOP FOR CLOCKS

BACKGROUND OF THE INVENTION

1. Field of the Invention

The present invention relates to an analog duty cycle correction loop that uses clock averaging and clock/voltage comparisons to determine whether a delay should be increased or decreased for a reference clock.

2. Related Art

Innumerable applications using clocks rely on a controlled clock duty cycle for optimal performance. Generally, a 50% duty cycle, in which a waveform has equal high and low portions, is considered desirable. Known duty cycle correction techniques use either a phase-locked loop (PLL) or a delay line loop (DLL) to double an input clock frequency, and then use a divide-by-two circuit to generate the desired frequency with a corrected duty cycle.

For example, FIG. 1 illustrates a known duty cycle correction circuit including a clock chopper circuit 101, a duty cycle comparator circuit 102, and a delay control circuit 103. Duty cycle comparator circuit 102 generates a square wave with a 50% duty cycle at one-half the input frequency (i.e. the digital clock) using a frequency divider 104, and then compares that square wave with the duty cycle corrected output clock (DCOUT). Delay control circuit 103 uses the output of duty cycle comparator circuit 102 to control clock chopper circuit 101. Clock chopper circuit 101 includes both coarse delay elements and fine delay elements that can form an adjustable delay. U.S. Pat. No. 5,757,218, which issued to Blum on May 26, 1998, describes this duty cycle correction circuit in greater detail. Notably, Blum is limited to correcting the duty cycle using digital delay elements.

Some applications may require or may benefit from an analog loop instead of a fully digital loop. Therefore, a need arises for a duty cycle correction technique/circuit using analog delay elements.

SUMMARY OF THE INVENTION

A method of providing duty cycle correction can include determining whether a clock signal has a duty cycle greater than 50% based on averaging the clock signal and comparing that averaged clock signal to a high voltage supply (e.g. ½ VDD). When the duty cycle is greater than 50%, the clock signal can be selected. In contrast, when the duty cycle is less than 50%, the inverted clock signal can be selected.

A duty cycle corrected clock signal can be generated based on one of the clock signal and the inverted clock signal. Notably, the duty cycle signal can be adjusted based on comparisons of an averaged duty cycle corrected clock signal and predetermined low/high voltage ranges. In one embodiment, components performing comparing functions can be strobed based on a count performed on the clock signal.

A duty cycle correction loop circuit can include a phase control circuit, a selection circuit, a duty cycle correction circuit, and a duty cycle adjustment generator. The phase control circuit can be used to determine whether a clock signal has a duty cycle greater than 50%. The selection circuit, which is controlled by the phase control circuit, selects the clock signal when the duty cycle is greater than 50% and selects an inverted clock signal when the duty cycle is less than 50%.

The duty cycle correction circuit, which is initially configured to only decrease the duty cycle, can generate a duty cycle corrected clock signal. The duty cycle adjustment generator can provide this signal to the duty cycle correction circuit. In one embodiment, the duty cycle adjustment generator can include first and second comparators, wherein each comparator receives a predetermined voltage threshold and an averaged duty cycle corrected clock signal (which is based on the duty cycle corrected clock signal). The predetermined voltage thresholds can be set based on a predetermined error range from a ½ VDD voltage. The output of the duty cycle adjustment generator is based on both the inverted and non-inverted outputs of the first and second comparators. Note that these comparison nodes effectively define a programmable zone in which the correction loop does not respond to a duty cycle at or within an error range of 50%.

The phase control circuit can include a first averaging clock circuit, first and second flip-flops, and a third comparator. The first averaging clock circuit (e.g. an RC circuit) can receive the clock signal. The second flip-flop, which is level sensitive, can have a D input terminal connected to the Q output terminal of the first flip-flop, a Q output terminal connected to a control terminal of the selection circuit, and a clock terminal for receiving a signal indicating receiving/transmitting of a device including the delay cycle correction loop circuit. The third comparator can receive an output of the first averaging clock circuit and a median voltage (e.g. ½ VDD), wherein a non-inverting output of the third comparator is coupled to the clock terminal of the first flip-flop and an inverting output of the third comparator is coupled to the reset terminal of the first flip-flop. In one embodiment, the selection circuit can include a multiplexer.

The duty cycle correction circuit can include a delay cell, a third flip-flop, and a buffering path. The delay cell can receive an output of the selection circuit. The third flip-flop has a D input terminal connected to a high supply voltage and a clock terminal coupled to an output of the delay cell. The buffering path can receive the output of the selection circuit and can provide an output to the reset terminal of the third flip-flop. In one embodiment, the delay cell can include a plurality of serially-connected resistors that are selectively bypassed based on delay cell control signals.

In one embodiment, the duty cycle correction circuit can further include an inverter for receiving an output of the selection circuit, and the delay cell can further include a pull-down transistor controlled by an output of the inverter. This pull-down transistor can advantageously ensure that the duty cycle corrected signal has an amplitude extending to ground.

The duty cycle adjustment generator can further include a second averaging clock circuit that is coupled to the Q output terminal of the third flip-flop and generates the averaged, duty cycle corrected clock. In one embodiment, the second averaging clock circuit can include a resistor/capacitor (RC) circuit.

The duty cycle adjustment generator can further include a first logic gate, a second logic gate, and an accumulator. The first logic gate can be connected to the non-inverted outputs of the first and second comparators, whereas the second logic gate can be connected to the inverted outputs of the first and second comparators. The accumulator can be connected to outputs of the first and second logic gates, and can generate the output of the duty cycle adjustment generator. In this configuration, the output of the first logic gate can increase a value of the accumulator and an output of the second logic gate can decrease the value of the accumulator.

In one embodiment, the duty cycle correction loop circuit can further include a loop stabilizer circuit. The loop stabilizer circuit can include a first counter and a second counter. The first counter can receive the clock signal on its clock terminal, where the second counter can receive an overload condition signal on its clock terminal, the overload condition signal being generated by the first counter. The second counter can generate a strobe signal, which is provided to the first and second comparators. In one embodiment, the first and second counters can be implemented as a single counter that generates the strobe signal.

BRIEF DESCRIPTION OF THE INVENTION

DETAILED DESCRIPTION OF THE INVENTION

Figure 1:
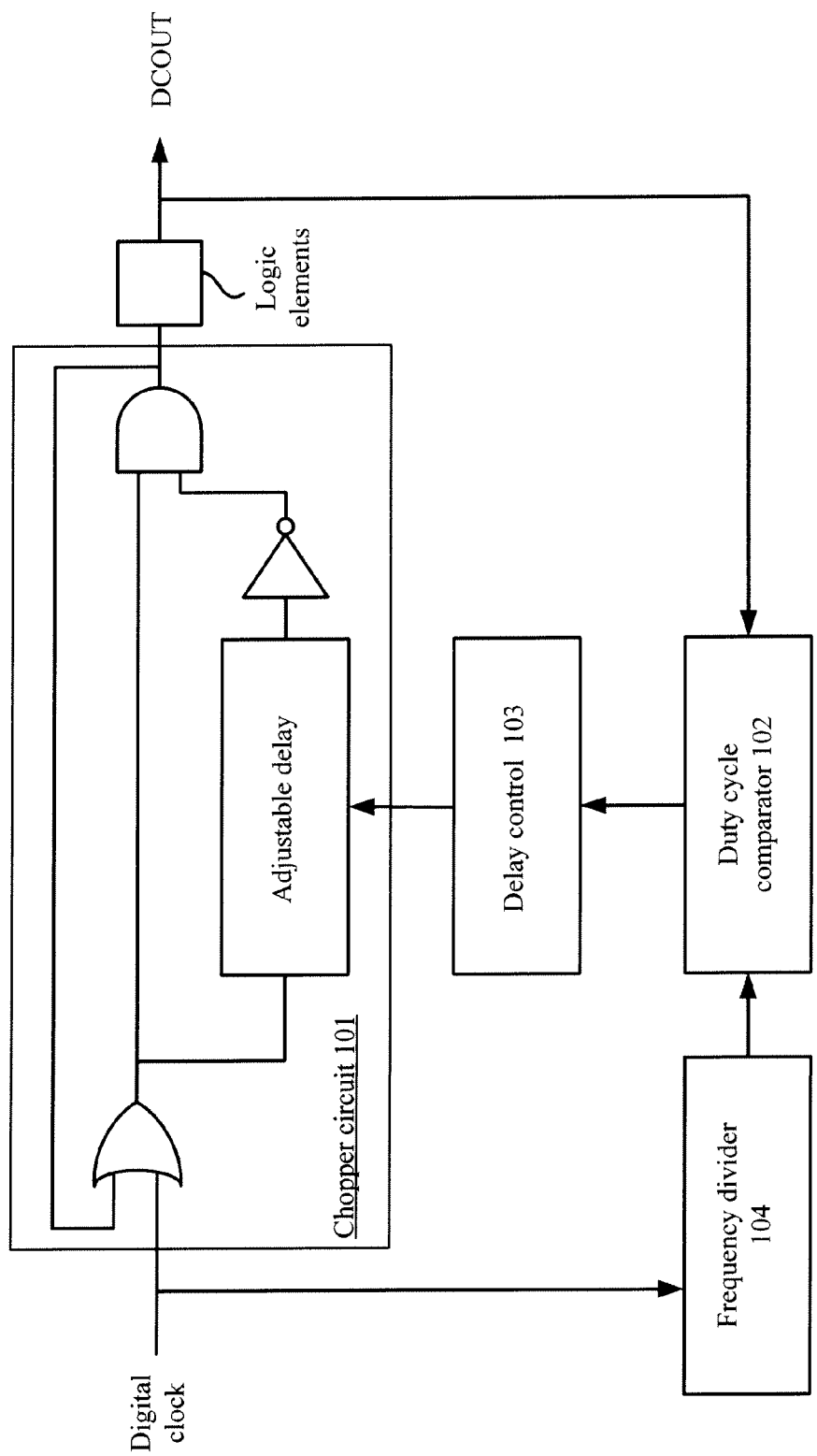
FIG. 1 illustrates a known duty cycle correction circuit having a digital loop.
Figure 2A:
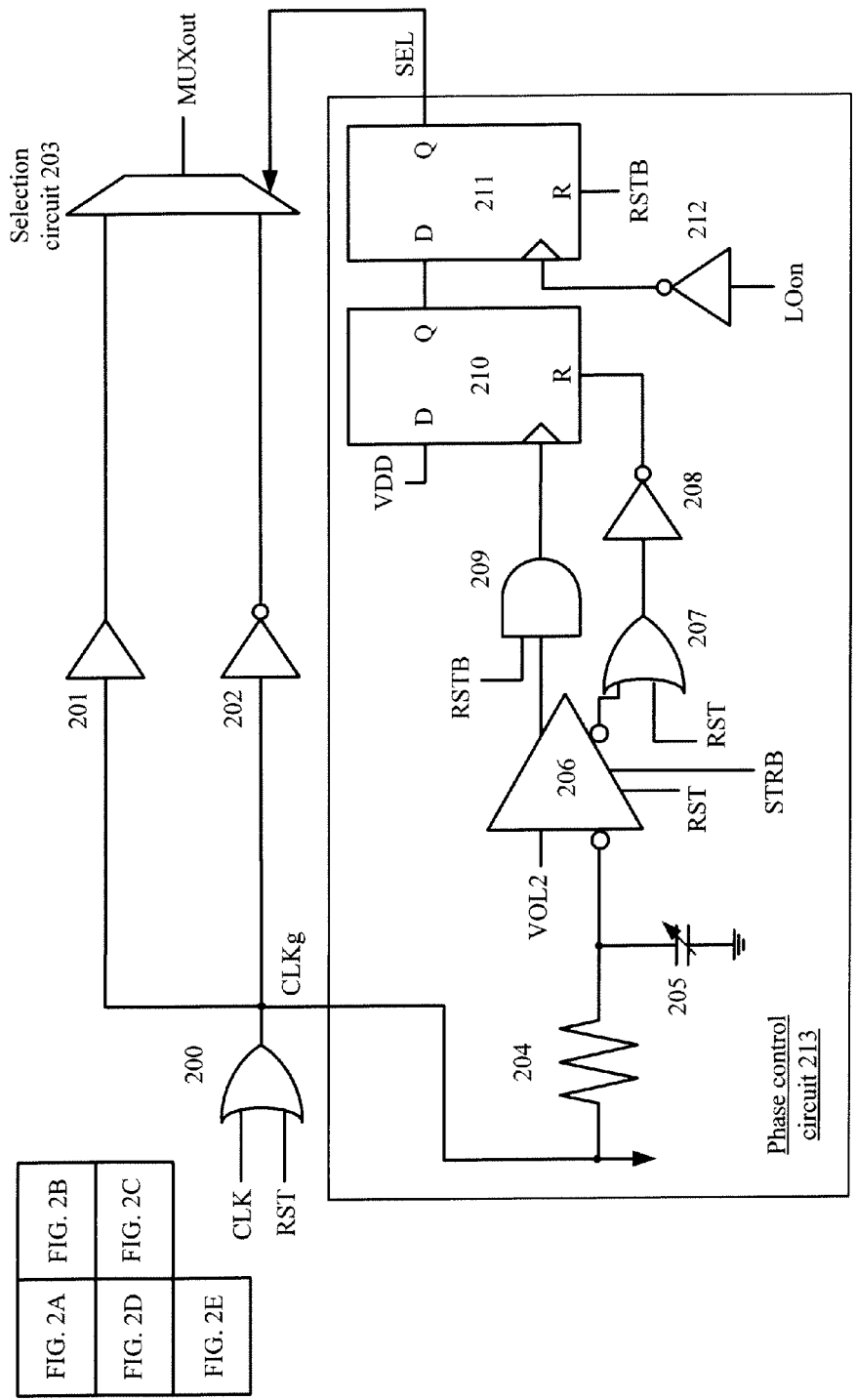
FIGS. 2A-2E illustrate an exemplary duty cycle correction circuit having an analog loop.

FIGS. 2A-2E illustrate an exemplary duty cycle correction circuit having an analog loop. Referring to FIG. 2A, an input clock signal CLK and reset signal RST are provided to an OR gate 200. Provided the reset signal RST is inactive (i.e. "0" for OR gate 200), the gated version of the input clock (CLKg) is relayed to both a buffer 201 and an inverter 202. Thus, the clock signal CLK is effectively divided into two phases. A selection circuit 203 (hereinafter referenced as a multiplexer for simplicity) can be used to selectively output one of the buffered clock and the inverted clock as a MUXout signal.

Figure 2B:
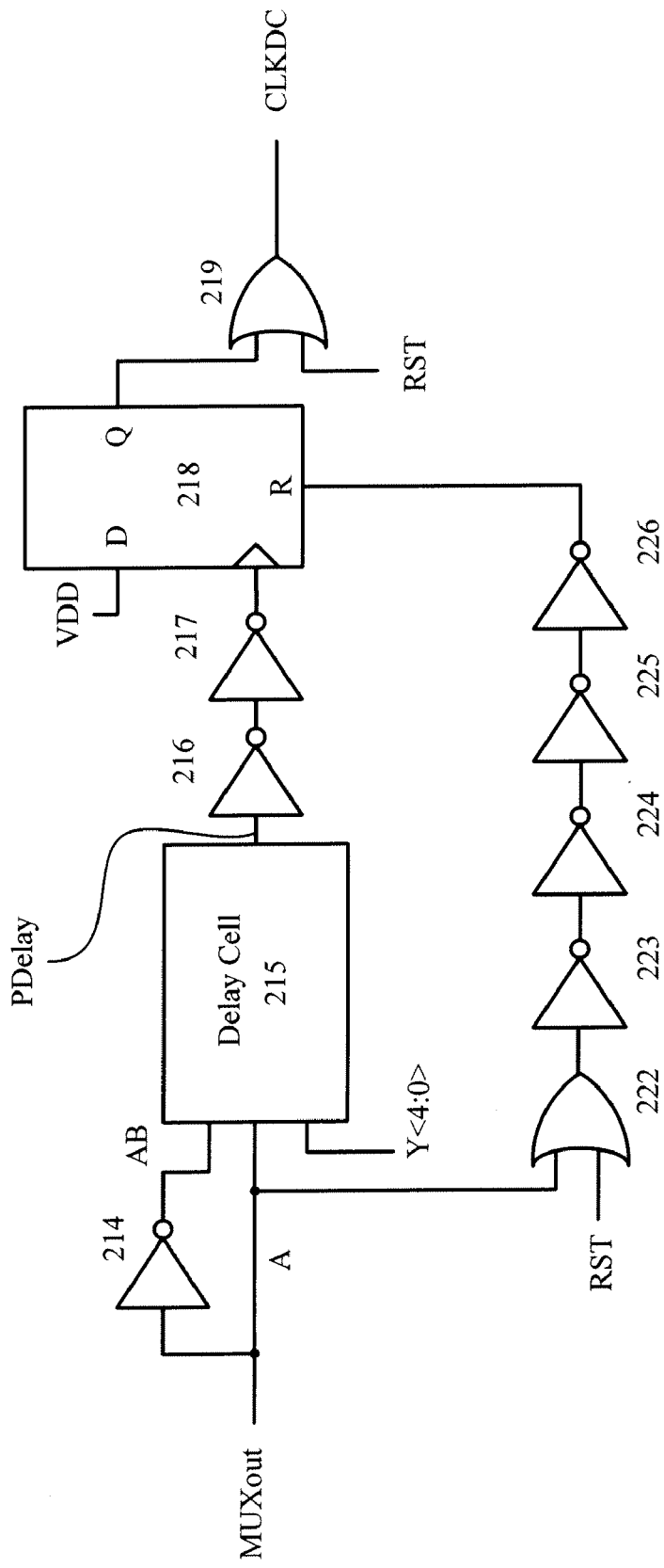

In one embodiment, a delay cell 215, which receives the MUXout signal and is discussed in further detail in reference to FIG. 2B, can be configured to only reduce a duty cycle. Therefore, multiplexer 203 can select the buffered clock when the clock signal CLKg has a duty cycle greater than 50%. In contrast, multiplexer 203 can select the inverted clock when the clock signal CLKg has a duty cycle less than 50%. Notably, inverting a clock signal that has a duty cycle less than 50% effectively generates a clock signal that has a duty cycle greater than 50%, thereby allowing delay cell 215 to perform duty cycle correction. A phase control circuit 213 can generate a select signal SEL that determines the appropriate output of multiplexer 203.

To select the appropriate phase of the clock, phase control circuit 213 includes a comparator 206 that compares a median voltage VOL2 (e.g. one-half of VDD) with an averaged clock signal generated by a resistor 204 and a capacitor 205 (an averaging clock circuit). In the embodiment shown in FIG. 2A, resistor 204 has a first terminal connected to receive the output of OR gate 200 (the gated input clock signal CLKg when not in a reset mode) and a second terminal connected to the inverted input terminal of comparator 206. Capacitor 205 is connected between the inverted terminal of comparator 206 and ground. In this configuration, resistor 204 and Capacitor 205 can form a very low pole resistor-capacitor (RC) filter. The median voltage VOL2 is provided to the non-inverting terminal of comparator 206.

Comparator 206 provides a first inverted output to an OR gate 207, which also receives the reset signal RST. The output of OR gate 208 is inverted by inverter 208 and then provided to the reset terminal of a flip-flop 210. Comparator 206 provides a second non-inverted output to an AND gate 209, which also receives the inverted reset signal RSTB. The output of AND gate 209 is provided to a clock terminal of flip-flop 210. The D input terminal of flip-flop 210 is connected to voltage VDD, whereas the Q output terminal of flip-flop 210 is connected to the D input terminal of another flip-flop 211 (which is level sensitive). In one embodiment, a local oscillator activation signal LOon is inverted by inverter 212 and then provided to the clock terminal of flip-flop 211. In this embodiment, an active LOon signal indicates that a wireless device is receiving or transmitting (and therefore flip-flop 211 is being clocked, which transfers the Q output of flip-flop 210 to flip-flop 211). The inverted reset signal RSTB is provided to the reset terminal of flip-flop 211. The Q output terminal of flip-flop 211 provides the control signal SEL to multiplexer 203. In this configuration, phase control circuit 213 can make a determination whether the duty cycle of the gated input clock signal CLKg is greater than or less than 50% and then chose the appropriate phase path provided to multiplexer 203.

Referring to FIG. 2B, which illustrates an exemplary duty cycle correction circuit 250, delay cell 215 receives the MUXout signal (also called the A signal), an inverted MUXout signal (generated by an inverter 214) (also called the AB signal), and a 5-bit signal Y<4:0>. In this embodiment, the A signal is also provided to an OR gate 222, which also receives the reset signal RST. Provided the reset signal RST is inactive (i.e. "0" for OR gate 222), the A signal is buffered by serially-connected inverters 223, 224, 225, and 226, and then provided to the reset terminal of a flip-flop 218. Note that inverters 223, 224, 225, and 226 can be used to match the minimum delay of the delay cell path, i.e. if duty cycle is 50%, then the two paths should have the same delay.

The output of delay cell 215 is also buffered by serially-connected inverters 216 and 217, and then provided to the clock terminal of flip-flop 218. The D input terminal of flip-flop 218 is connected to voltage VDD, whereas the Q output terminal of flip-flop 218 is connected to an OR gate 219. The output of flip-flop 218 provides a duty cycle corrected clock signal.

Thus, in this configuration, the MUXout signal is effectively routed along two paths: a first path terminating at the clock terminal of flip-flop 218 and a second path terminating at the reset terminal of flip-flop 218. In one embodiment, a rising edge of MUXout signal sends the signal at the D input terminal (i.e. a high supply voltage VDD) of flip-flop 218 to its Q output terminal. Also in this embodiment, a falling edge of the MUXout signal provided to the reset terminal resets the Q output to "0".

Figure 3:
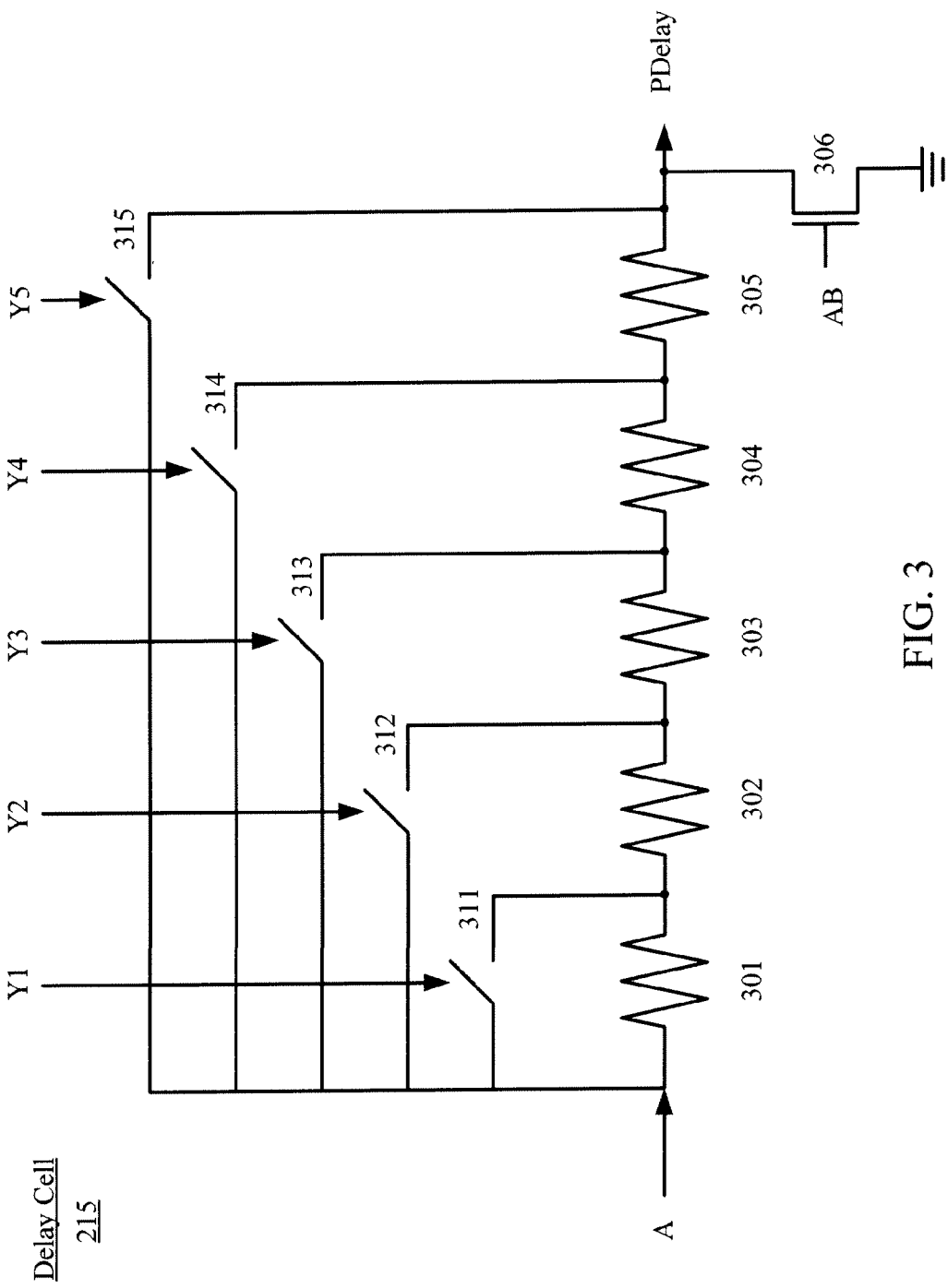
FIG. 3 illustrates an exemplary delay cell for the duty cycle correction circuit.

FIG. 3 illustrates a simplified delay cell 215. In this embodiment, switches 311-315 can be used to bypass one or more of serially-connected resistors 301-305. For example, when switch 311 is closed, then the A signal bypasses resistor 301. When switch 314 is closed, then the A signal bypasses resistors 301, 302, 303, and 304. The 5-bit signal Y<4:0> can include signals Y1-Y5 that control switches 311-315 (wherein only one switch can be closed at any time). Delay cell 215 can generate a programmable delay signal PDelay. Note that inverter 216 is a relatively large component (e.g. in the range of 0.3-0.4 picofarads) that has an associated capacitance. This capacitance in combination with the PDelay signal actually comprise an RC delay. Further note that the number of resistors/switches/switch control signals can be increased or decreased in other embodiments. For example, in one embodiment, an actual delay cell 215 can include 32 switches and 32 resistors, wherein the 5-bit control signal is provided to a de-multiplexer, which in turn generates 32 control signals. This delay cell embodiment functions similarly to delay cell 215 and provides a wider range of control.

Figure 4:
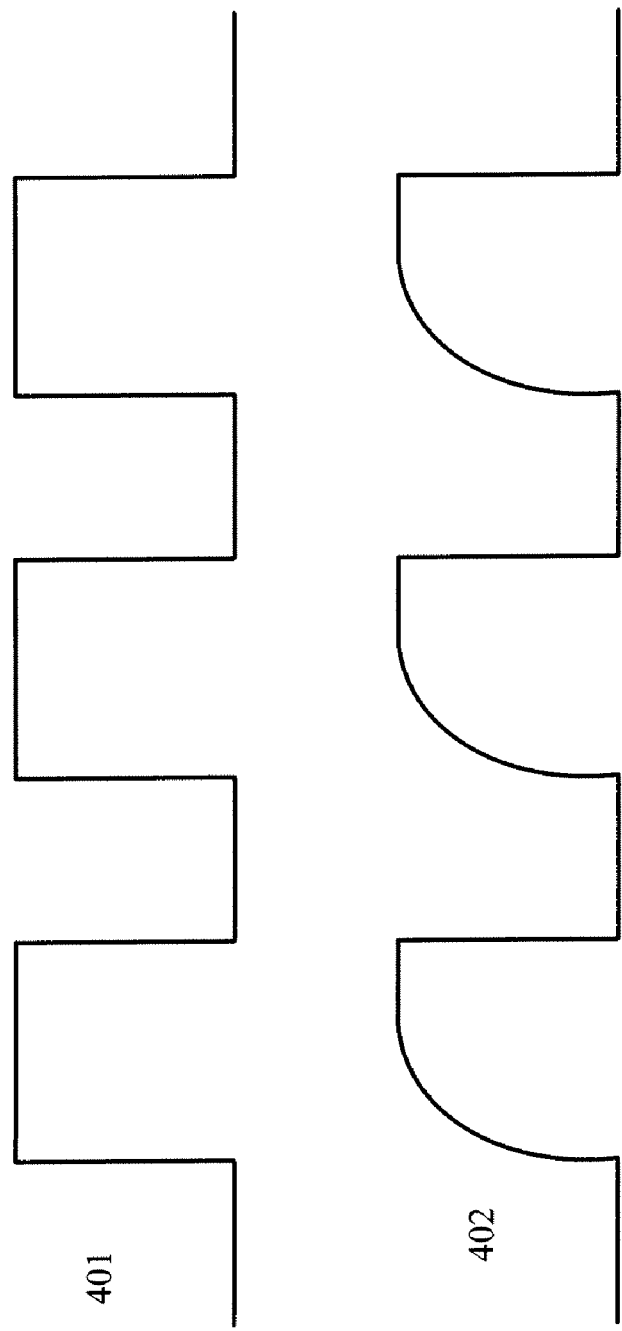
FIG. 4A illustrates an exemplary input clock signal that has greater than a 50% duty cycle.
FIG. 4B illustrates an exemplary waveform generated using the delay cell shown in FIG. 4A.

FIG. 4A illustrates an exemplary input clock signal 401 that has greater than a 50% duty cycle. FIG. 4B illustrates an exemplary waveform 402 generated by delay cell 215, i.e. the PDelay signal shown in FIG. 2B. As demonstrated by comparing waveforms 401 and 402, delay cell 215 effectively delays the rising time of the input clock signal 401 to generate waveform 402. Note that without inverter 214 (FIG. 2B) and transistor 306 (FIG. 3) (which performs a quick pull-down when the AB signal is high), waveform 402 would not have time to return to ground potential (i.e. transistor 306 can effectively bypass the RC network).

Referring back to FIG. 2B, inverters 216 and 217 can sharpen the corners of (i.e. "square-up") waveform 402 before it is applied to the clock terminal of flip-flop 218. Notably, by using a buffering path including inverters 223-226 to trigger the reset of flip-flop 218, the falling edge remains the same. Thus, duty cycle correction circuit 250 only affects the rising edge of waveform 401. When delay cell 215 is accurately configured, flip-flop 218 can output a squared clock signal, which is at or within a predetermined range of a 50% duty cycle.

In summary, delay cell 215 can advantageously affect the rising of the input clock signal using the first path terminating at the clock terminal of flip-flop 218. The second path terminating at the reset terminal of flip-flop 218 can be used to ensure that the falling edge of the signal remains the same as before duty cycle correction. Therefore, in combination, the first and second paths can advantageously affect only the length of the high pulse (which affects the duty cycle).

In this embodiment, OR gate 219 also receives the reset signal RST. Provided the reset signal RST is inactive (i.e. "0" for OR gate 219), OR gate 219 provides the Q output of flip-flop 218, i.e. a duty cycle corrected clock signal CLKDC as an output of duty cycle correction circuit 250.

Figure 2C:
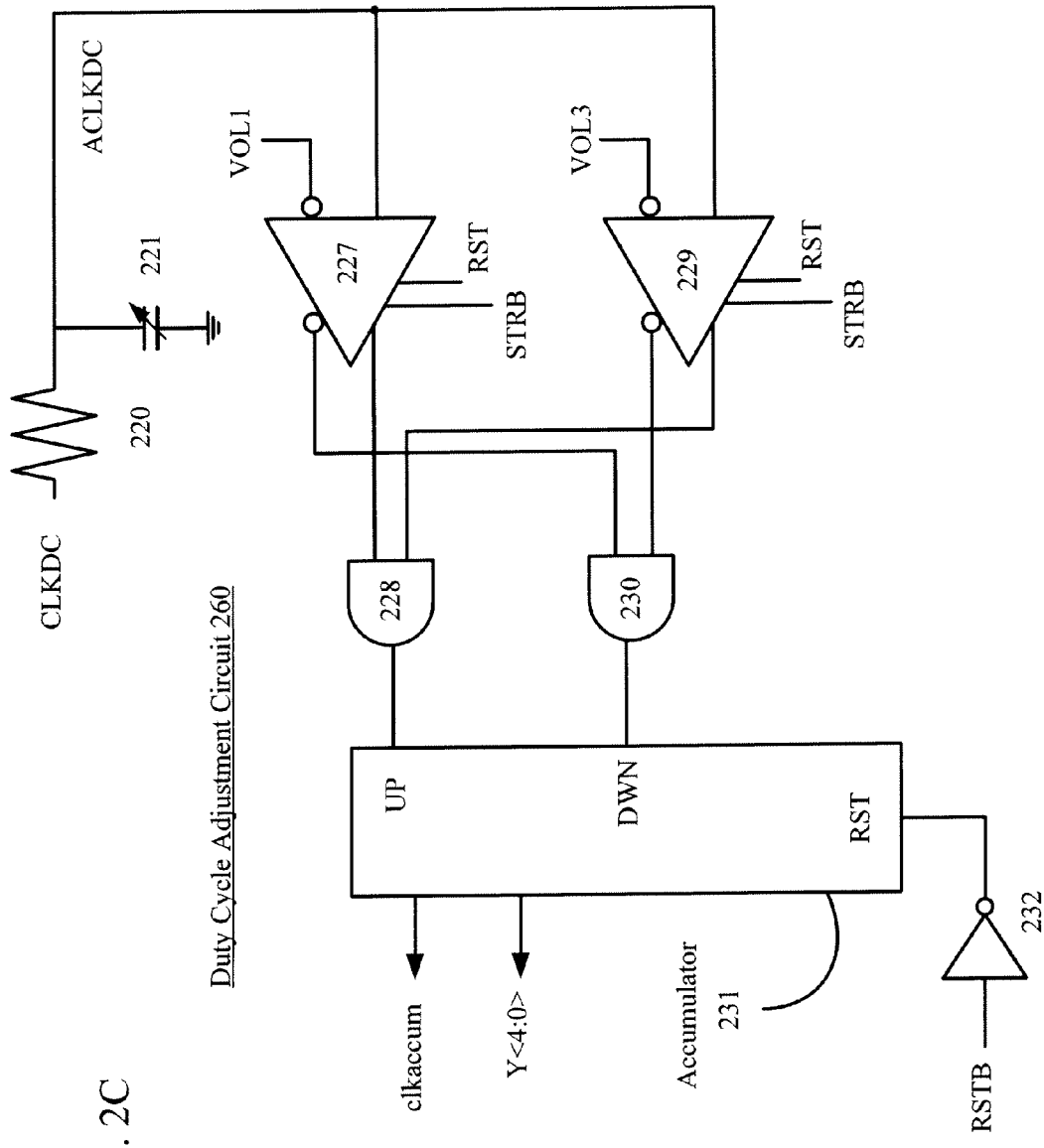

Referring to FIG. 2C, which illustrates an exemplary duty cycle adjustment generator 260, the CLKDC signal is then provided to another averaging clock circuit, e.g. comprising a resistor 220 and a capacitor 221 (which form a very low pole resistor-capacitor (RC) filter). In this embodiment, a first terminal of resistor 220 is connected to the output of OR gate 219, whereas a second terminal of resistor 220 is connected to the non-inverting terminals of two comparators 227 and 229 (see FIG. 2C) (i.e. an averaged, duty cycle corrected clock signal ACLKDC is provided to comparators 227 and 229). Capacitor 221 is connected between the second terminal of resistor 220 and ground.

Comparator 227 receives the ACLKDC signal on its non-inverting terminal and a low-side voltage VOL1 on its inverting terminal. Comparator 229 also receives the ACLKDC signal on its non-inverting terminal and a high-side voltage VOL3 on its inverting terminal. In one embodiment, if VDD is 1.2 V, then the average of a perfect clock signal should be 0.6 V. Therefore, this average could be compared to 0.594 V (low-side voltage VOL1) and 0.606 V (high-side voltage VOL3) for a 1% total duty cycle error. Other embodiments could include different ranges for VOL1 and VOL3, which could be greater or less than the exemplary 1% range.

The inverting outputs of comparators 227 and 229 are provided to an AND gate 230, which controls a subtraction function in an accumulator 231. In contrast, the non-inverting outputs of comparators 227 and 229 are provided to an AND gate 230, which controls an addition function in accumulator 231. Accumulator 231 outputs the 5-bit signal Y<4:0>. In this embodiment, an inverted reset signal RSTB can be inverted by inverter 232 and then provided to the reset terminal of accumulator 231.

In this configuration, when comparators 227 and 229 generate "0s" at their inverting and "1" at their non-inverting output terminals, then the output duty cycle is more than 50% and the delay should be increased. In this case, accumulator 231 (which starts at zero, i.e. a "no delay" output) increases by 1 bit to increase the delay. On the other hand, when comparators 227 and 229 generate "1s" at their inverting and "0s" at their non-inverting terminals, then the duty cycle is less than 50%. In this case, accumulator 231 decreases by one bit to decrease the delay.

Note that the duty cycle can only be decreased for an initial input clock because accumulator 231 is initialized to zero (which corresponds to zero delay). In contrast, after the duty cycle is decreased and somehow the duty cycle has drifted and needs to be corrected, then the duty cycle can be increased. In accordance with one aspect of this embodiment, as long as the output clock average is within the selected error range (as defined by VOL1 and VOL3), then the loop is disconnected and there is no feedback effect. In this manner, going back and forth between two adjacent control words is prevented.

Figure 2D:
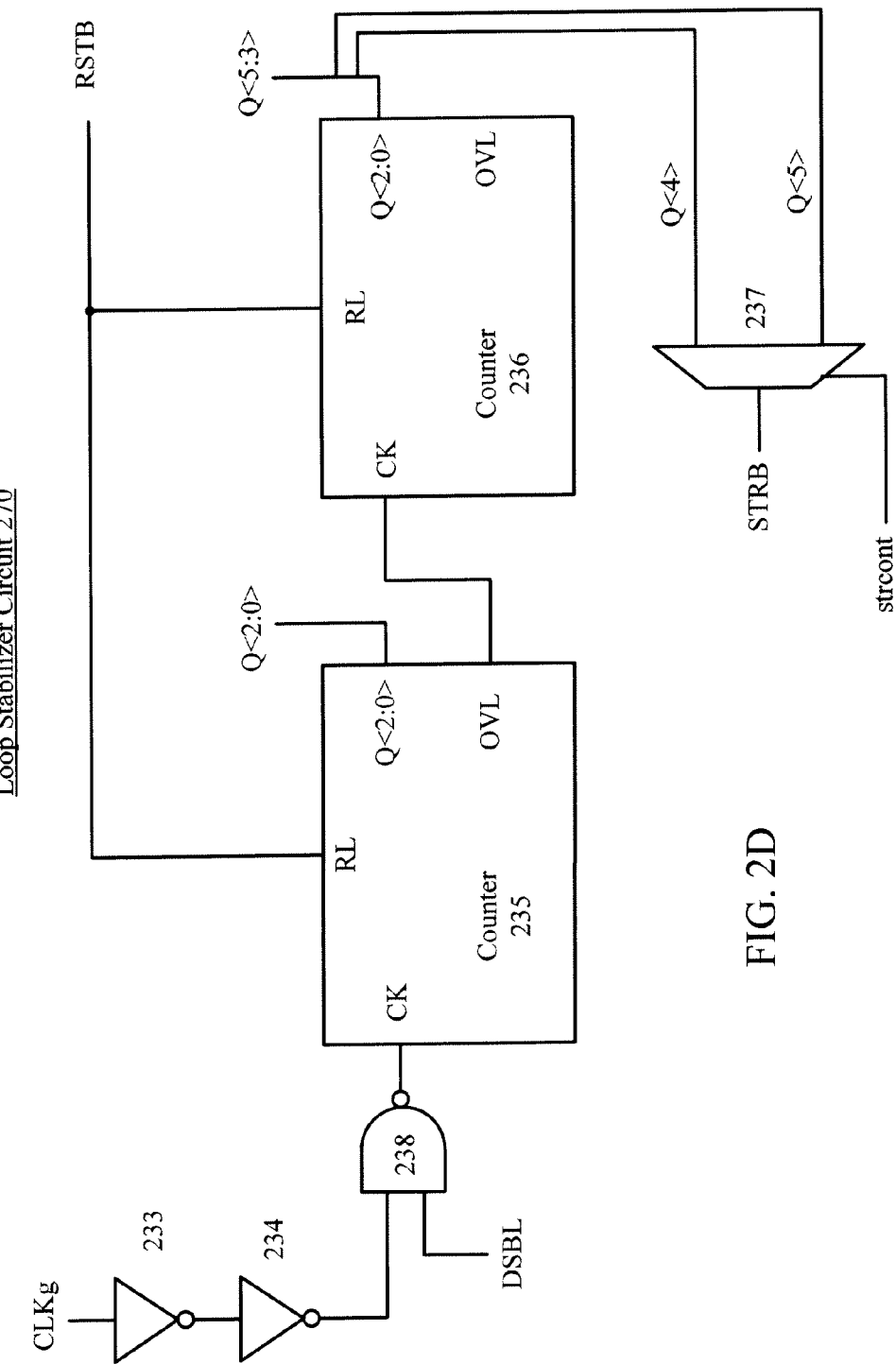

Referring to FIG. 2D, which illustrates an exemplary loop stabilizer circuit 270, counters 235 and 236 can be used to generate a strobe signal STRB, which is provided to comparators 227, 229 (FIG. 2C), and 206 (FIG. 2A) to slow the loop and prevent instability. In one embodiment, this strobe signal STRB is a slower version of the incoming clock. To generate this slower version, the CLKg signal is buffered by inverters 233 and 234 and then divided by 64 using counters 235 and 236 (e.g. 3-bit counters). Note that the size of counters 235 and 236 is a balance between response time and stability, and therefore may vary between actual applications.

When counter 235 reaches an overload condition, then counter 236 is clocked. Note that counters 235 and 236 also receive the inverted reset signal RSTB. In one embodiment, the first and second counters can be implemented as a single counter that generates the strobe signal. In one embodiment, the reset signal RST and the inverted reset signal RSTB can be generated at the system level and can advantageously be used to quickly turn off the duty cycle correction loop.

Figure 2E:
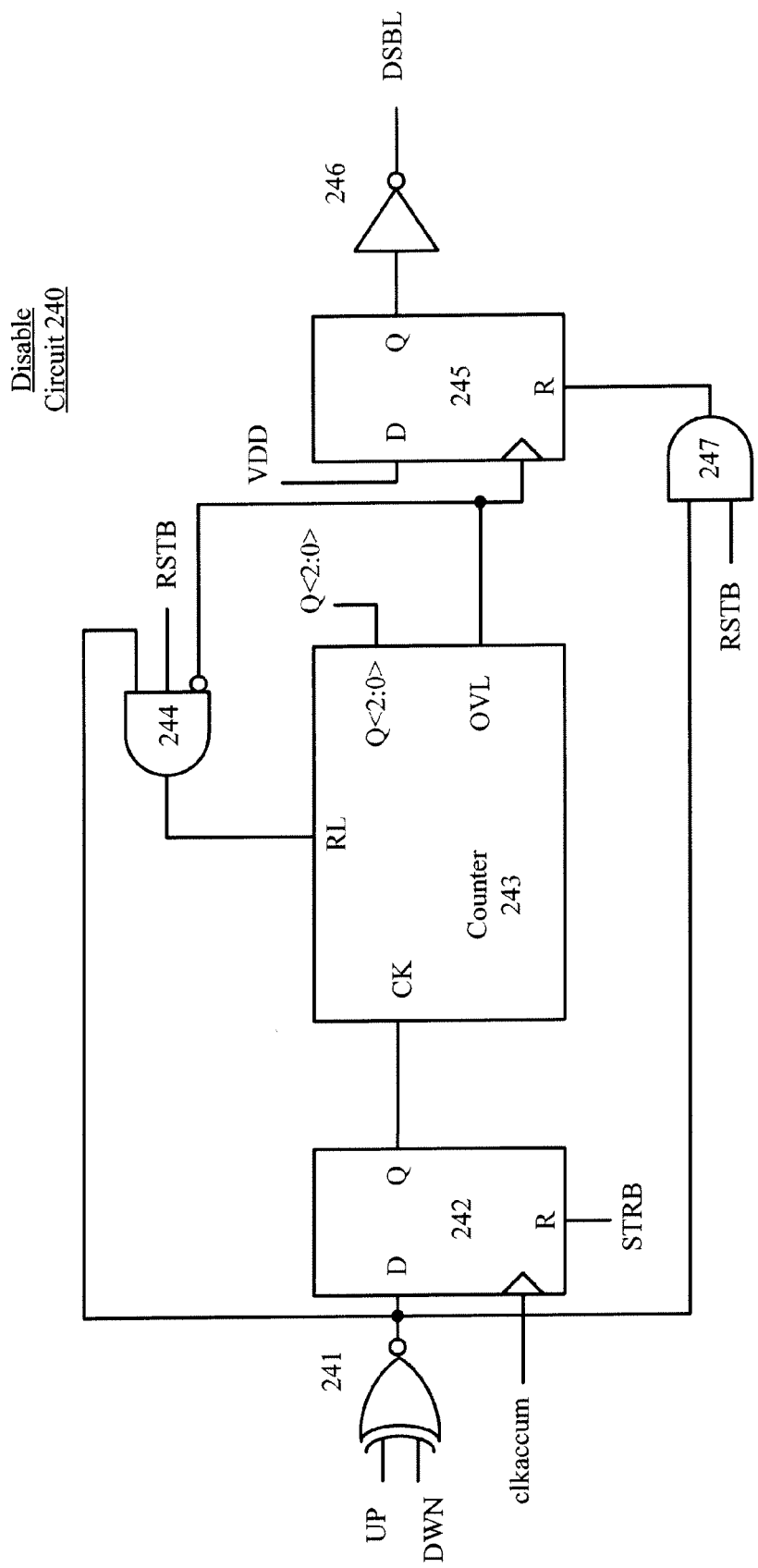

FIG. 2E illustrates an exemplary disable circuit 240 that can disable loop stabilizer circuit 270 when the analog loop is settled. In one embodiment, disable circuit 240 can include an XOR gate 241 that receives the UP and DWN signals generated by AND gates 228 and 230 (FIG. 2C). XOR gate 241 provides its output to an AND gate 244, an AND gate 247, and a D input terminal of a flip-flop 242. Flip-flop 242, in turn, provides its Q output to a clock terminal of a counter 243. Flip-flop 242 has a reset terminal that receives the strobe signal STRB and a clock terminal that receives a clock accumulation signal clkaccum (described below). In one embodiment, counter 243 is a 3-bit counter that receives Q<2:0> bits and has a reset terminal controlled by an output of AND gate 244. AND gate 244 also receives the system level reset signal RSTB and an inverted overload signal generated by counter 243. This overload signal is also provided to a clock terminal of a flip-flop 245. AND gate 247, which also receives the system level reset signal RSTB, controls the reset terminal of flip-flop 245. The D input terminal of flip-flop 245 is connected to VDD, whereas the Q output of flip-flop 245 is inverted by inverter 246, which generates the disable signal DSBL.

In this configuration, counter 243 looks for 8 consecutive clkaccum pulses (generated by accumulator 231, FIG. 2C) when both the UP and DOWN signals are "0". At this point, disable circuit 240 disables the clock of counter 235 (FIG. 2D) using a NAND gate 238 that receives the disable signal DSBL (generated by disable circuit 240) and the buffered, gated clock CLKg. At this point, if there is an UP-DOWN pulse, then counter 235 can once again receive the buffered, gated clock CLKg and disable circuit 240 starts counting for another 8 "0s".

Figure 5:
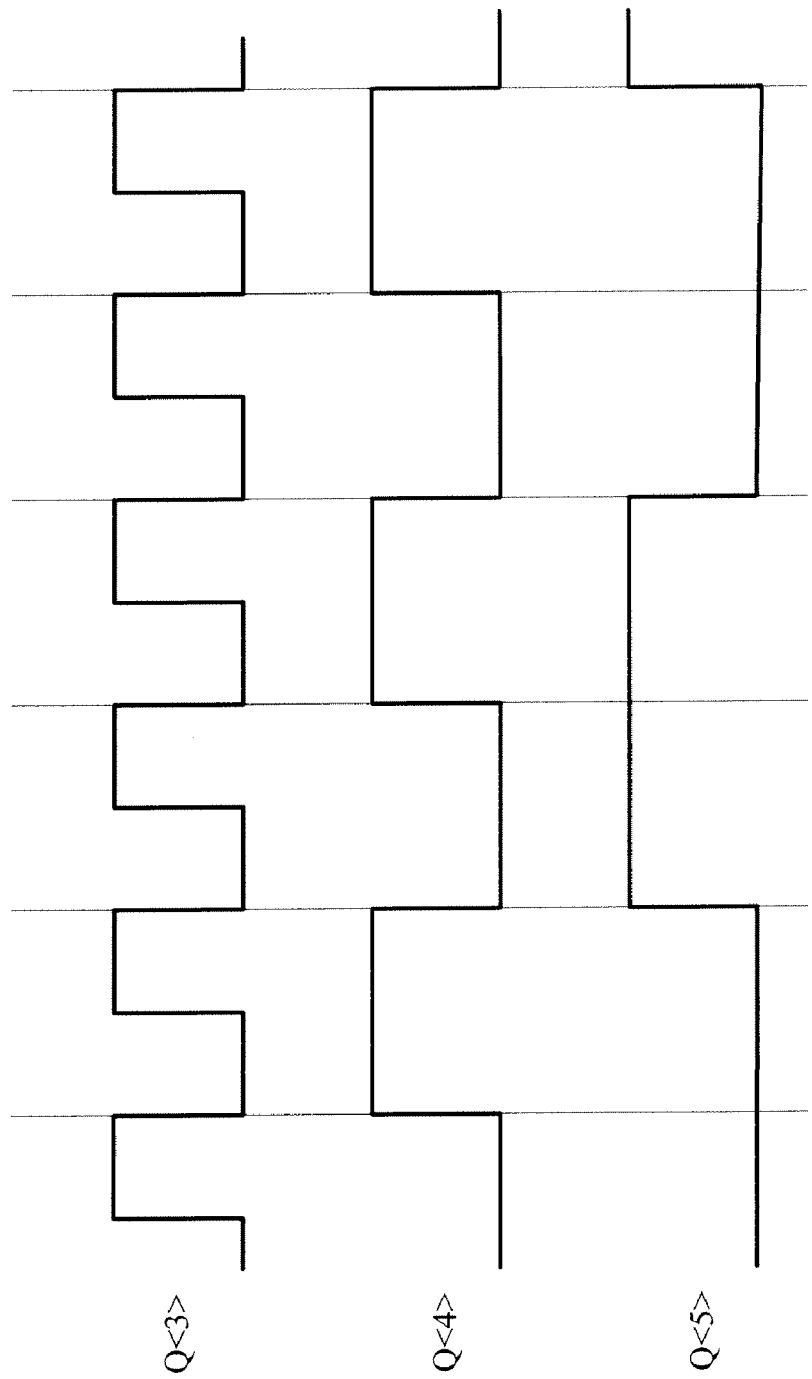
FIG. 5 illustrates exemplary waveforms generated by a loop stabilization circuit.

FIG. 5 illustrates exemplary waveforms for Q<3>, Q<4>, and Q<5>, wherein Q<5> represents the most significant bit and is ×64 slower than Q<0>. Referring back to FIG. 2D, Q<4> and Q<5> can be provided to a multiplexer 237, which selects one of the two as the strobe signal STRB. This strobe signal STRB triggers the comparators to perform the comparison function.

A strobe control signal strcont is used to select between Q<4> and Q<5>. In one embodiment, the stroncont signal (e.g. a system control signal) selects Q<4> when it is desirable to settle 2× faster (i.e. than if the stroncont signal selects Q<5>). In one embodiment, accumulator 231 can receive a clock signal that is based on when an overflow condition is about to happen or actually happens at counter 236. Note that the accumulator clock advantageously occurs after the strobe signal STRB triggers the comparators (for a compare operation) to ensure rise and hold times of the accumulator. Note that in some embodiments, a single Q<N> can be used, thereby eliminating the need for multiplexer 237.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art. Accordingly, it is intended that the scope of the invention be defined by the following Claims and their equivalents.

The invention claimed is:

1. A duty cycle correction loop circuit comprising:
   a phase control circuit for determining whether a clock signal has a duty cycle greater than 50%;
   a selection circuit controlled by the phase control circuit that selects the clock signal when the duty cycle is greater than 50% and selects an inverted clock signal when the duty cycle is less than 50%;
   a duty cycle correction circuit that initially is configured to only decrease the duty cycle and generates a duty cycle corrected clock signal; and
   a duty cycle adjustment generator providing an output to the duty cycle correction circuit, the duty cycle adjustment generator including first and second comparators, each comparator receiving a predetermined voltage threshold and an averaged duty cycle corrected clock signal based on the duty cycle corrected clock signal, wherein the output of the duty cycle adjustment generator is based on inverted and non-inverted outputs for each of the first and second comparators.

2. The duty cycle correction loop circuit of claim 1, wherein the phase control circuit includes:
   a first averaging clock circuit receiving the clock signal;
   a first flip-flop having a D input terminal, a Q output terminal, a clock terminal, and a reset terminal;
   a second flip-flop having a D input terminal connected to the Q output terminal of the first flip-flop, a Q output terminal connected to a control terminal of the selection circuit, and a clock terminal for receiving a signal indicating receiving/transmitting of a device including the delay cycle correction loop circuit; and
   a third comparator for receiving an output of the first averaging clock circuit and a median voltage, wherein a non-inverting output of the third comparator is coupled to the clock terminal of the first flip-flop and an inverting output of the third comparator is coupled to the reset terminal of the first flip-flop.

3. The duty cycle correction loop circuit of claim 2, wherein the first averaging clock circuit includes a resistor/capacitor (RC) circuit.

4. The duty cycle correction loop circuit of claim 1, wherein the selection circuit includes a multiplexer.

5. The duty cycle correction loop circuit of claim 1, wherein the duty cycle correction circuit includes:
   a delay cell that receives an output of the selection circuit; and
   a third flip-flop having a D input terminal connected to a high supply voltage, a Q output terminal, a clock terminal coupled to an output of the delay cell, and a reset terminal.

6. The duty cycle correction loop circuit of claim 5, wherein the delay cell includes a plurality of serially-connected resistors that are selectively bypassed based on delay cell control signals.

7. The duty cycle correction loop circuit of claim 6, wherein the duty cycle correction circuit further includes an inverter for receiving an output of the selection circuit, and wherein the delay cell further includes a pull-down transistor controlled by an output of the inverter.

8. The duty cycle correction loop circuit of claim 5, wherein the duty cycle correction circuit further includes a buffering path that receives the output of the selection circuit and provides an output to the reset terminal of the third flip-flop.

9. The duty cycle correction loop circuit of claim 5, wherein the duty cycle adjustment generator includes:
   a second averaging clock circuit coupled to the Q output terminal of the third flip-flop and generating an averaged, duty cycle corrected clock.

10. The duty cycle correction loop circuit of claim 9, wherein the second averaging clock circuit includes a resistor/capacitor (RC) circuit.

11. The duty cycle correction loop circuit of claim 1, wherein the duty cycle adjustment generator includes:
    a first logic gate connected to the non-inverted outputs of the first and second comparators;
    a second logic gate connected to the inverted outputs of the first and second comparators; and
    an accumulator connected to outputs of the first and second logic gates, and generating the output of the duty cycle adjustment generator,
    wherein an output of the first logic gate increases a value of the accumulator and an output of the second logic gate decreases the value of the accumulator.

12. The duty cycle correction loop circuit of claim 1, further including a loop stabilizer circuit, the loop stabilizer circuit including:
    a first counter for receiving the clock signal on its clock terminal; and
    a second counter for receiving an overload condition signal on its clock terminal, the overload condition signal generated by the first counter,
    wherein the second counter generates a strobe signal provided to the first and second comparators.

13. A method of providing duty cycle correction, the method comprising:
- using a duty cycle correction loop circuit,
- determining whether a clock signal has a duty cycle greater than 50% based on averaging the clock signal and comparing an averaged clock signal to ½ a high voltage supply;
- selecting the clock signal when the duty cycle is greater than 50%;
- selecting an inverted clock signal when the duty cycle is less than 50%;
- generating a duty cycle corrected clock signal based on one of the clock signal and the inverted clock signal; and
- adjusting the duty cycle signal based on comparisons of an averaged, duty cycle corrected clock signal and predetermined low/high voltage ranges.

14. The method of claim 13, further including strobing components performing comparing functions based on a count performed on the clock signal.

* * * * *